(12) United States Patent
Shibamoto et al.

(10) Patent No.: US 7,477,520 B2
(45) Date of Patent: Jan. 13, 2009

(54) MEMORY MODULE

(75) Inventors: Masanori Shibamoto, Chuo-ku (JP); Nae Hisano, Chiyoda-ku (JP)

(73) Assignee: Elpida Memory, Inc., Tokyo (JP)

( * ) Notice: Subject to any disclaimer, the term of this patent is extended or adjusted under 35 U.S.C. 154(b) by 212 days.

(21) Appl. No.: 11/391,450

(22) Filed: Mar. 29, 2006

(65) Prior Publication Data

US 2006/0244126 A1 Nov. 2, 2006

(30) Foreign Application Priority Data

Apr. 4, 2005 (JP) ............................. 2005-107069

(51) Int. Cl.
*H05K 7/20* (2006.01)
*H01L 23/52* (2006.01)

(52) U.S. Cl. ................. 361/719; 361/684; 361/704; 361/705; 257/723; 257/724; 257/737; 257/E23.079; 257/E23.084

(58) Field of Classification Search ............ 361/684, 361/704, 719; 257/723, 724, 737
See application file for complete search history.

(56) References Cited

U.S. PATENT DOCUMENTS

| 5,276,289 | A | * | 1/1994 | Satoh et al. ............. 174/260 |
| 6,949,826 | B2 | * | 9/2005 | Wang .................... 257/737 |
| 2003/0128518 | A1 | * | 7/2003 | Gaynes et al. ........... 361/704 |
| 2006/0268519 | A1 | * | 11/2006 | Bartley et al. ............ 361/699 |
| 2008/0106860 | A1 | * | 5/2008 | Jafari et al. .............. 361/684 |

FOREIGN PATENT DOCUMENTS

| JP | 63-192256 A | 8/1988 |
| JP | 3-153095 A | 7/1991 |
| JP | 9-102565 A | 4/1997 |
| JP | 9-283958 A | 10/1997 |
| JP | 10-275883 A | 10/1998 |
| JP | 11-354701 A | 12/1999 |
| JP | 2004-165605 A | 6/2004 |

OTHER PUBLICATIONS

Office Action from Counterpart Japanese Application with Statement of Relevance regarding the above listed references. (2005).

* cited by examiner

*Primary Examiner*—Dao H Nguyen
(74) *Attorney, Agent, or Firm*—Sughrue Mion, PLLC

(57) ABSTRACT

In a memory module, a plurality of semiconductor memory packages are arranged and mounted on a module board, and a control semiconductor package is disposed in a central region of the arrangement of the semiconductor memory packages, and mounted on the module board. A control semiconductor radiator thermally connected to the control semiconductor package, and a semiconductor memory radiator thermally connected to the plurality of memory packages are disposed without being thermally connected to each other in relation to a direction in which the semiconductor memory packages are arranged.

17 Claims, 19 Drawing Sheets

MEMORY MODULE

BACKGROUND OF THE INVENTION

1. Field of the Invention

The present invention relates to a memory module. In particular, the present invention relates to a memory module which is mounted with a control semiconductor package, for example, an AMB (Advanced Memory Buffer) package and the like, and supports high speeds and large capacities in the field of memory modules which are utilized as main memories for personal computers, servers, workstations and the like. This type of memory is suitable, for example, for FB-DIMM (Fully Buffered Dual-In-Line Memory).

2. Description of the Related Art

As a conventional memory module, there is one shown in JP-A-11-354701. The memory module disclosed in this official gazette has a removable cover-like heat sink (radiator) mounted on a module board on which memory IC's such as DRAM are mounted along both sides, in order to dissipate heat generated from the memory IC's. The heat sink is made of a flexible material and has an inverted C-shape in cross section in the mounting direction to the board. The inner surface of the inverted C-shape is kept in contact with the memory IC's through a highly thermally conductive member such as highly thermally conductive rubber, and multiple asperities are formed on the outer surface of the inverted C-shape.

Recently, FB-DIMM has been proposed for a memory module for a server system which is required to provide high speeds and large capacity. The FB-DIMM has a plurality of semiconductor memory packages (DRAM packages) arranged and mounted on a module board, and a control semiconductor package (AMB package) disposed in a central region of the semiconductor memory package array.

In such a FB-DIMM, the control semiconductor package, which generates a larger amount of heat than the semiconductor memory packages, is mounted in the central region where there is the arrangement of a plurality of semiconductor memory packages, so that there is concern for a temperature rise in the semiconductor memory packages mounted near the control semiconductor package. Therefore, it is contemplated to use one radiator, in a manner similar to the conventional example which uses one radiator, and dispose this radiator over both the control semiconductor package and semiconductor memory packages. In this event, however, there is a concern that the semiconductor packages are affected by high temperatures of the control semiconductor package, resulting in failure to produce a cooling effect, though the temperature of the entire module is leveled out. In particular, when a control semiconductor package is used which exhibits a heatproof temperature that is higher than the allowable heatproof temperature of semiconductor memory packages, a problem is highly likely to arise in regard to the reliability of the semiconductor memory packages.

SUMMARY OF THE INVENTION

It is an object of the present invention to provide a memory module which is capable of maintaining semiconductor memory packages and a control semiconductor packages at their respective appropriate temperatures to ensure the reliability of both.

To achieve the object mentioned above, a memory module of the present invention has a plurality of semiconductor memory packages arranged and mounted on a module board, and a control semiconductor package disposed in a central region having the array of the semiconductor memory packages and mounted on the module board, wherein a control semiconductor radiator thermally connected to the control semiconductor package, and a semiconductor memory radiator thermally connected to the plurality of semiconductor memory packages, are disposed without being thermally connected to each other in a direction in which the semiconductor memory packages are arranged.

According to one aspect of the present invention, a multi-layered semiconductor memory package stacked in a plurality of layers may be used as the semiconductor memory package.

The control semiconductor radiator and the semiconductor memory radiator may be constituted of different members, and a gap may be formed between the control semiconductor radiator and the semiconductor memory radiator in the direction in which the semiconductor memory packages are arranged to provide a non thermally connected part.

The control semiconductor radiator and the semiconductor memory radiator connected to the control semiconductor package and the semiconductor memory package mounted on the same side of the module board are mounted such that their respective projection planes deviate from each other.

A notch recess may be formed in a central region of the semiconductor memory radiator, wherein the control semiconductor radiator may be disposed within a projection plane of the notch recess.

The control semiconductor radiator and the semiconductor memory radiator may be constituted of the same member, and a non thermally connected part may be defined between the control semiconductor radiator and the semiconductor memory radiator in the direction in which the semiconductor memory packages are arranged.

The non thermally connected part may be formed of a slit extending in a direction which intersects the direction in which the semiconductor memory packages are arranged.

The control semiconductor package may have a heatproof temperature that is higher than the allowable heatproof temperature of the semiconductor memory package, and the control semiconductor radiator may be provided with radiation fins.

The radiation fins provided on the control semiconductor radiator can be ventilated in any of front, rear, left and right directions.

Each control semiconductor radiator and each semiconductor memory radiator may be provided with radiation fins along a wind direction.

DESCRIPTION OF THE PREFERRED EMBODIMENTS

Figure 1:
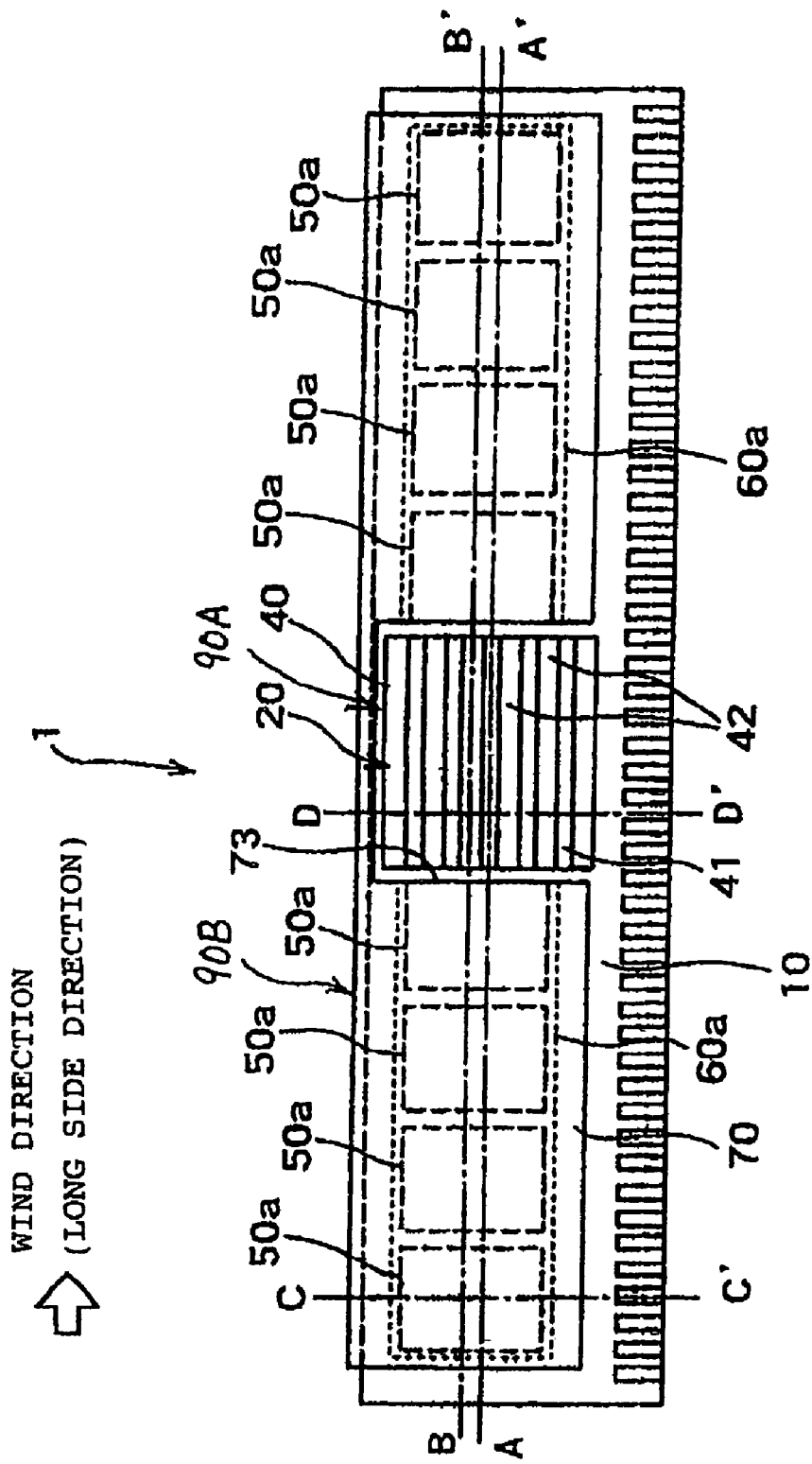
FIG. 1 is a top plan view illustrating a memory module according to a first embodiment of the present invention.

In the following, a plurality of embodiments of the present invention will be described with reference to the drawings. The same reference numerals in figures of respective embodiments designate the same or corresponding parts. As can be appreciated, the present invention is not limited to disclosed forms, but modifications can be permitted based on the prior art and the like.

Embodiment 1

A memory module according to a first embodiment of the present invention will be described with reference to FIGS. 1 to 9.

First, overall memory module 1 of this embodiment will be described with reference to FIGS. 1 to 7.

Memory module 1 comprises module board 10, control semiconductor package 20, control semiconductor radiator 90A, semiconductor memory packages 50, and semiconductor memory radiator 90B. This memory module 1 has a plurality of semiconductor memory packages 50 arranged and mounted on module board 10, and control semiconductor package 20 disposed in a central region on a plane in which semiconductor memory packages 50 are arranged, and mounted on module board 10.

Specifically, this memory module 1 is FB-DIMM which is used as a main memory for a high-performance server, and employs AMB control semiconductor package 20 as a control semiconductor to realize both high speeds and large capacity (provision of multiple slots) of semiconductor memory packages 50 comprised of DRAM packages. This memory module 1 is mounted with a plurality (eight in the illustrated example) of semiconductor memory packages 50a arranged in a line on an a-side, with a space reserved for two semiconductor memory packages in a central region of the arrangement, and mounted with one control semiconductor package 20 in that space, and this memory module 1 is mounted with a plurality (ten in the illustrated example) of semiconductor memory packages 50b in a line on b-side. Semiconductor memory packages 50 is a generic name of semiconductor memory packages 50a, 50b.

Control memory chip 21, which is in the shape of a square having one side several millimeters in length, is mounted on package board 23 whose dimensions are 24.5 mm×19.5 mm, where the outer dimensions of the package are larger than control semiconductor chip 21. Also, control semiconductor chip 21 generates heat in a range of 2.4 W to 3.4 W, which is significantly larger than semiconductor memory chips 51-54, each of which generates heat in a range of several tens mW to several hundreds mW. Also, when memory module 1 is ventilated at an air velocity of 1.5 to 3.0 m/s, an upper allowable temperature of package 20 is set to 105° C. or lower and an upper allowable temperature of package 50 is set to 85° C. or lower. Memory package 50 has a lower heatproof temperature than that of package 20.

Control semiconductor radiator 90A is disposed on control semiconductor package 20. This control semiconductor radiator 90A comprises heat pass material 30 disposed on control semiconductor package 20, and radiation member 40 disposed on this heat pass material 30. Radiation member 40 comprises base 41 and plate fins 42. Base 41 is disposed with its bottom surface in close contact with the top surface of heat pass material 40, such that it is thermally connected to heat pass material 30. Plate fins 42 are formed to rise from the top surface of base 41, and extend along a wind direction.

Semiconductor memory radiator 90B is disposed on semiconductor memory package 50. This semiconductor memory radiator 90B comprises heat pass material 60 disposed on semiconductor memory package 50, and radiation member 70 disposed on this heat pass material 70. Heat pass material 60 and radiation member 70 are disposed to extend across a plurality of semiconductor memory packages 50.

Radiation member 40 and radiation member 70 are comprised of separate members, and are maintained so as not to be in contact with or to adhere to each other. Therefore, radiation member 40 and radiation member 70 are not thermally connected to each other. A material for radiation members 40, 70 is preferably a metal having high thermal conductivity, for example, an alloy of aluminum or copper, or the like. By providing such radiation members 40, 70, heat is properly radiated from the heated regions of chips 21, 51-55 in respective packages 20, 50 by radiation members 40, 70, respectively, so that they are cooled down to their respective heatproof allowable temperatures or lower. Heat pass materials 30, 60 are preferably made of glutinous and highly thermally conductive silicon resin base in the form of sheet, gel, paste or the like. This is used to reduce thermal resistance between packages 20, 50 and radiation members 40, 70 to reduce a rise in temperature.

Figure 2:
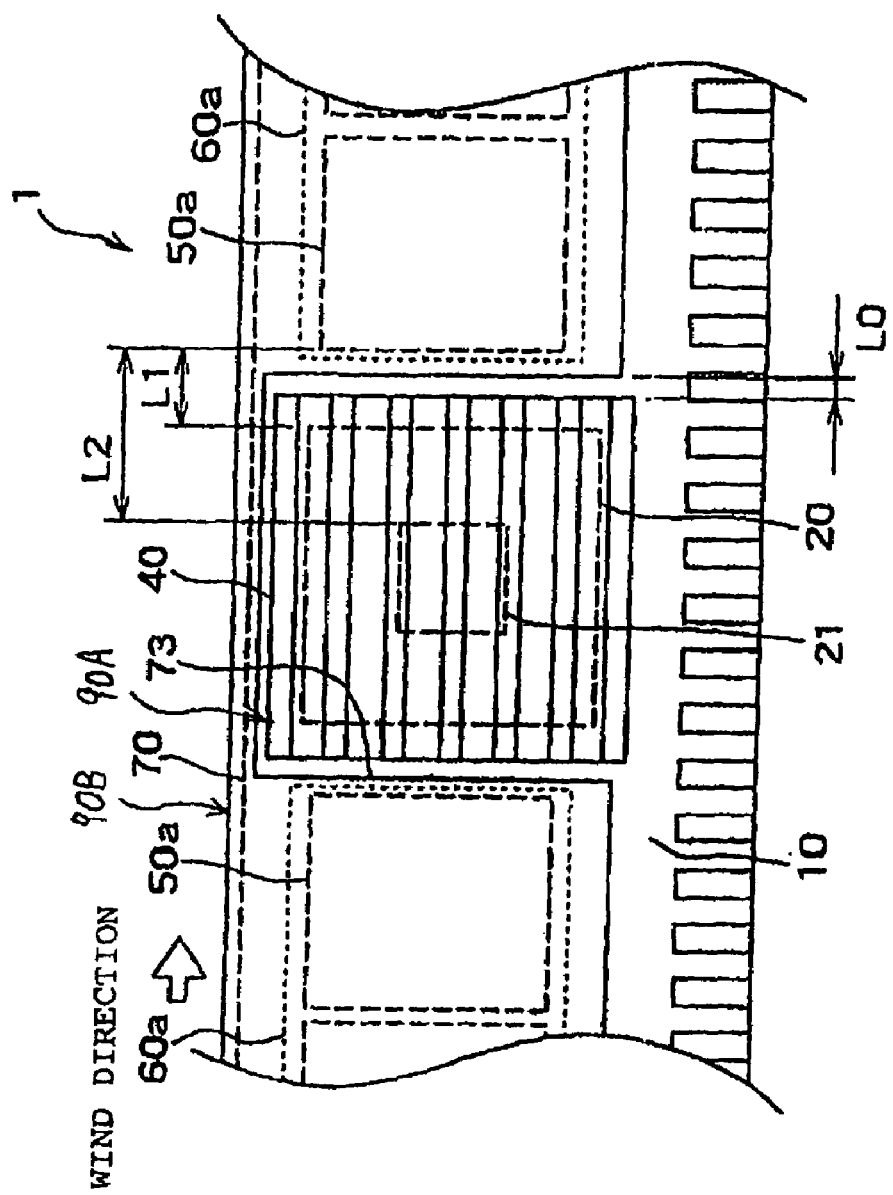
FIG. 2 is an enlarged view of a central region of the memory module in FIG. 1.

As illustrated in FIG. 2, radiation member 70 has notch 73, and is configured to surround radiation member 40. Gap L0 is defined between both parties 40, 70, such that they are not in contact with each other. In other words, radiation member 40 is disposed within a projection plane of notch 73. Also, radiation member 40 and radiation member 70 are not adhered through an intermediate member. Also, this gap L0 is positioned to be included in gap L1 between semiconductor memory package 50, adjacent to control semiconductor package 20 on the downstream side, and control semiconductor package 20 or between gap L2 between the same semiconductor memory package 50 and control semiconductor package chip 21. In this way, since a high temperature field centered at control semiconductor package 20 is broken between radiation member 40 and radiation member 70, a rise in temperature can be reduced in semiconductor memory package 50.

Figure 3:
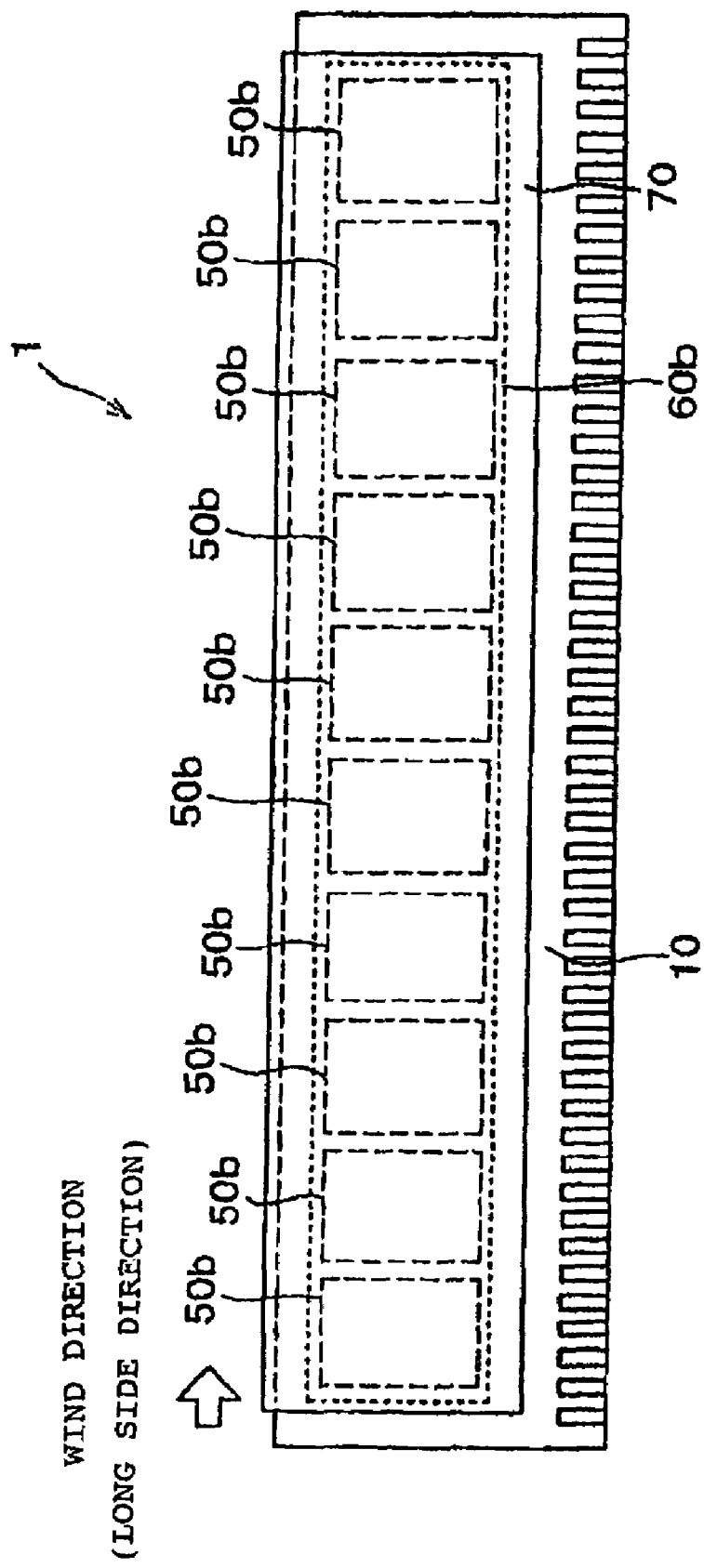
FIG. 3 is a bottom view of the memory module in FIG. 1.

As illustrated in FIG. 3, ten memory packages 50b are mounted on the b-side, on which no control semiconductor package is mounted, and radiation member 70 is disposed thereon through heat pass member 60.

Figure 4:
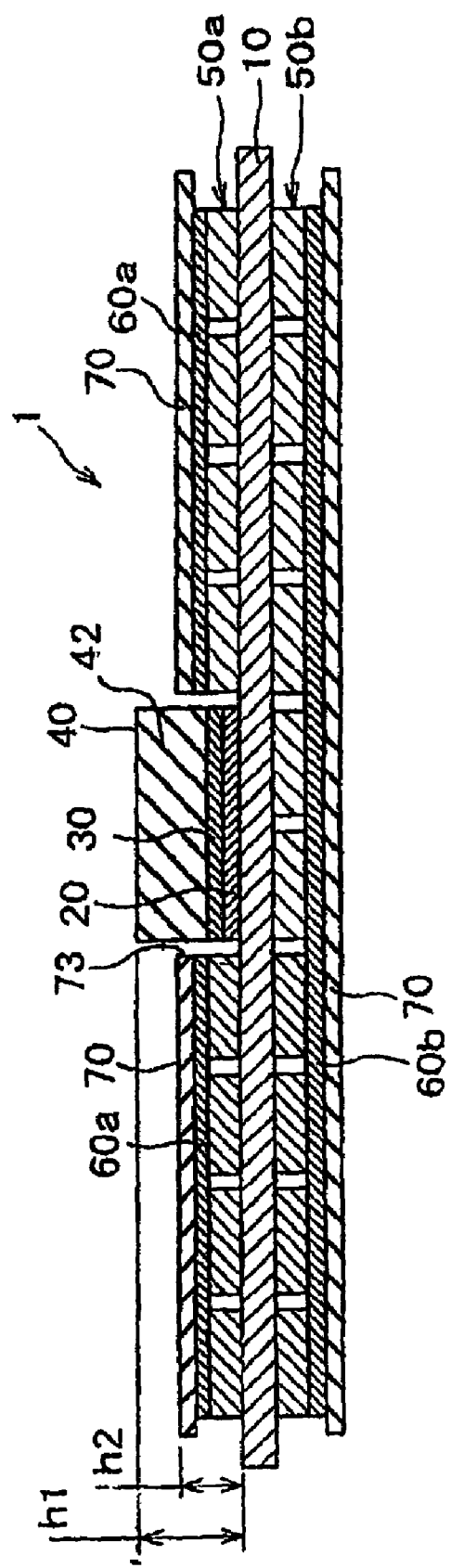
FIG. 4 is a cross-sectional view taken along A-A' in FIG. 1.

As illustrated in FIG. 4, plate fins 42 of radiation member 40 have upper ends projecting higher than the top surface of radiation member 47, and plate fins 42 of radiation member 40 has mounting height h1 higher than mounting height h2 of radiation member 70.

Figure 5:
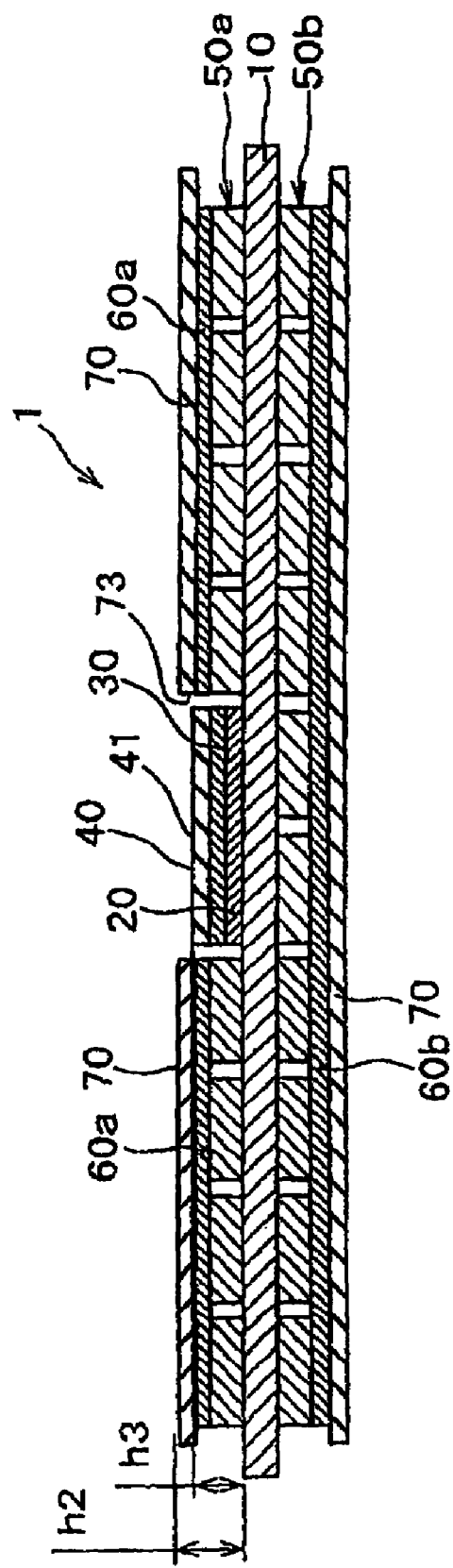
FIG. 5 is a cross-sectional view taken along B-B' in FIG. 1.

As illustrated in FIG. 5, base 41 of radiation member 40 has a top surface which sinks lower than the top surface of radiation member 70, and base 41 of radiation member 40 has mounting height h3 lower than mounting height h2 of radiation member 70.

Figure 6:
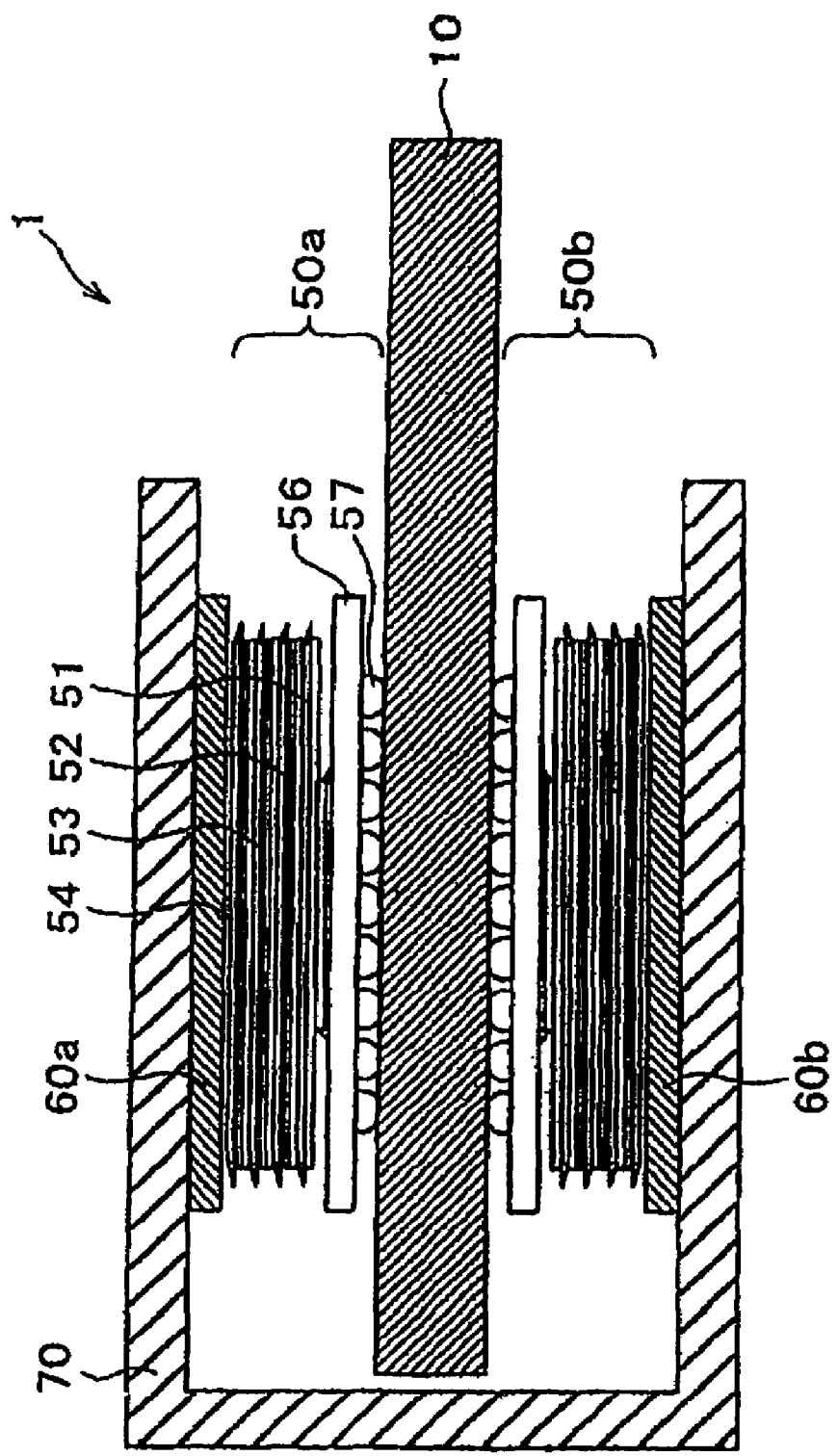
FIG. 6 is an enlarged cross-sectional view taken along C-C' in FIG. 1.

As illustrated in FIG. 6, semiconductor memory packages 50 are mounted on both sides (a-side and b-side) of module board 10. Radiation member 70 is formed in an inverted C-shape, and is disposed to sandwich semiconductor memory packages 50 on both a- and b-sides through heat pass material 60. The internal structure of the package will be described in connection with semiconductor memory package 50 on the a-side. Semiconductor memory package 50 is a multi-layered package which contains four semiconductor memory chips 51-54 and interface chip 55. Interface chip 55 is a flip-chip connected to package board 56 to establish electric conduction, while semiconductor memory chips 51-54 are separately packaged and electrically connected to package board 56 through external terminals, not shown. Module board 10 and package board 56 are electrically connected through bump-shaped external terminal 57. While the multi-layered package is covered in FIG. 6, this is because layered chips are thermally difficult due to an increase in generated heat substantially proportional to the number of chips. However, since the amount of heat generated by semiconductor memories tends to increase with an increase in operating frequency, the present invention is also useful for a package having one chip.

Figure 7:
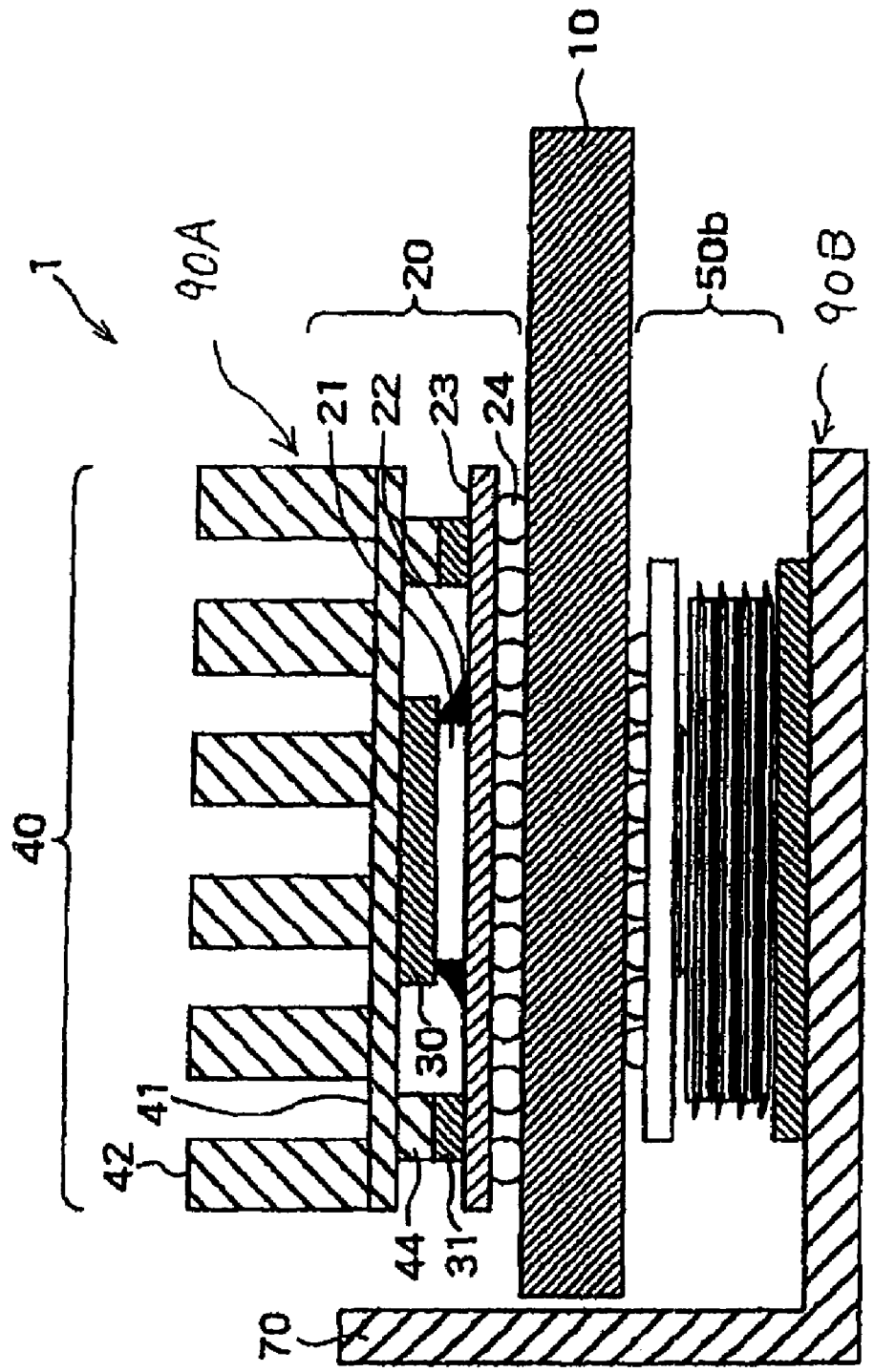
FIG. 7 is an enlarged cross-sectional view taken along D-D' in FIG. 1.

FIG. 7 illustrates a cross-sectional view of an area in which control semiconductor package 20 is mounted on the a-side of module board 10, and semiconductor memory package 50b is mounted on the b-side. Control semiconductor package 20 has control semiconductor chip 21 flip-chip connected to package board 23, and the side surfaces and the bottom surface of chip 21 are sealed by underfill resin 22. Package board 23 and module board 10 are electrically connected through bump-shaped external terminals 24. Radiation member 40 is disposed over the chip through heat pass member 30. Also, for maintaining adhesion stability of radiation member 40, a plurality of protrusions 44 are formed below radiation member 40, and are disposed over package board 23 through heat pass material 31. Radiation member 70 disposed around semiconductor memory package 50b on the b-side of module board 10 is cut halfway through the upper side, and is formed to have an L-shaped cross section.

Next, the cooling effect by memory module 1 of this embodiment will be described with reference to FIGS. 7 to 9.

Figure 8:
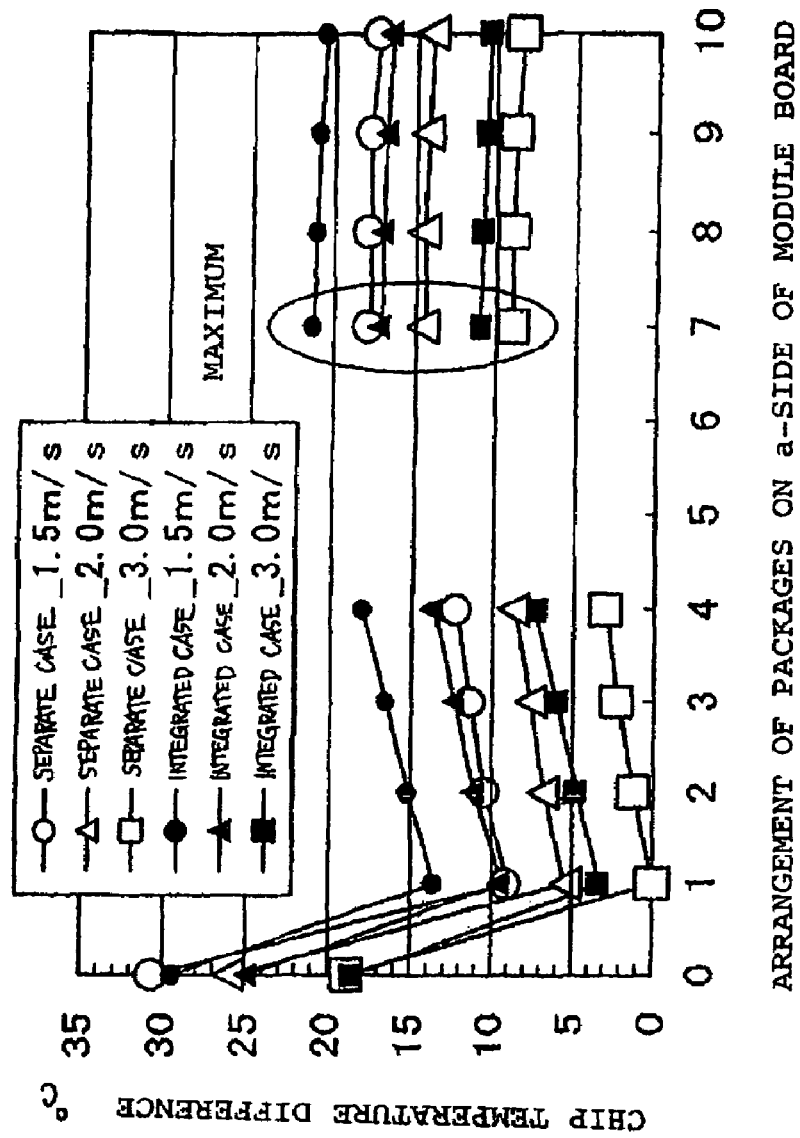
FIG. 8 is a diagram showing an analysis of chip temperatures of the memory module in FIG. 1.
Figure 9:
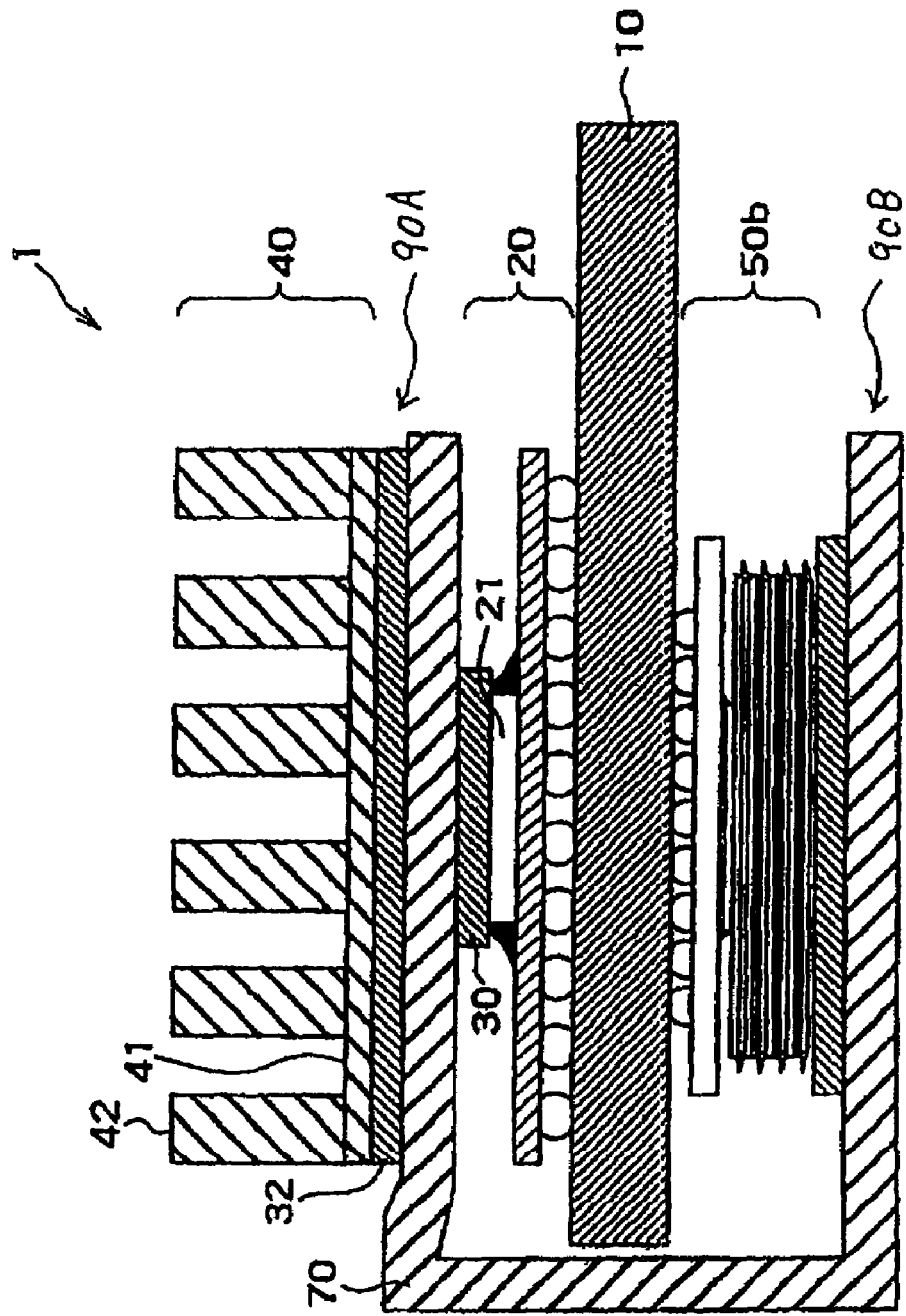
FIG. 9 is a cross-sectional view of a memory module of a comparative example.

FIG. 8 shows an example of analyzed maximum temperatures of control semiconductor package 20 and respective semiconductor memory chips in semiconductor memory package 50a mounted on the a-side. As structure parameters, a comparison was made between a case where control semiconductor radiator 90A was completely separated from semiconductor memory radiator 90B as illustrated in FIG. 7 (separate case), and a case where radiation member 70 was thermally connected up to above the semiconductor control chip through heat pass material 40, and radiation member 40 was thermally connected to this extended radiation member 70 through heat pass material 32 as illustrated in FIG. 9 (integrated case). Air cooling was conducted under the conditions of 1.5 m/s to 3.0 m/s along the long side direction of the module. On the horizontal axis, 0 designates the control semiconductor chip, and 1-4 and 7-10 indicate the order of the semiconductor memory chips from the windward side. The vertical axis indicates a difference in temperature from the minimum value (the first semiconductor memory from the windward side, at air velocity of 3 m/s in a separate case) of the analyzed maximum chip temperatures. As is apparent from FIG. 8, it is understood that the integrated case exhibits a slightly lower maximum chip temperature in regard to control semiconductor package 20, whereas the separate case exhibits a significantly lower maximum chip temperature in regard to semiconductor memory package 50. It is understood that the maximum temperature within the semiconductor memory chip can be reduced in the separate case by 1.5° C. at an air velocity of 1.5 m/s and by approximately 2° C. at an air velocity of 3 m/s at the seventh position from the windward side.

Figure 10:
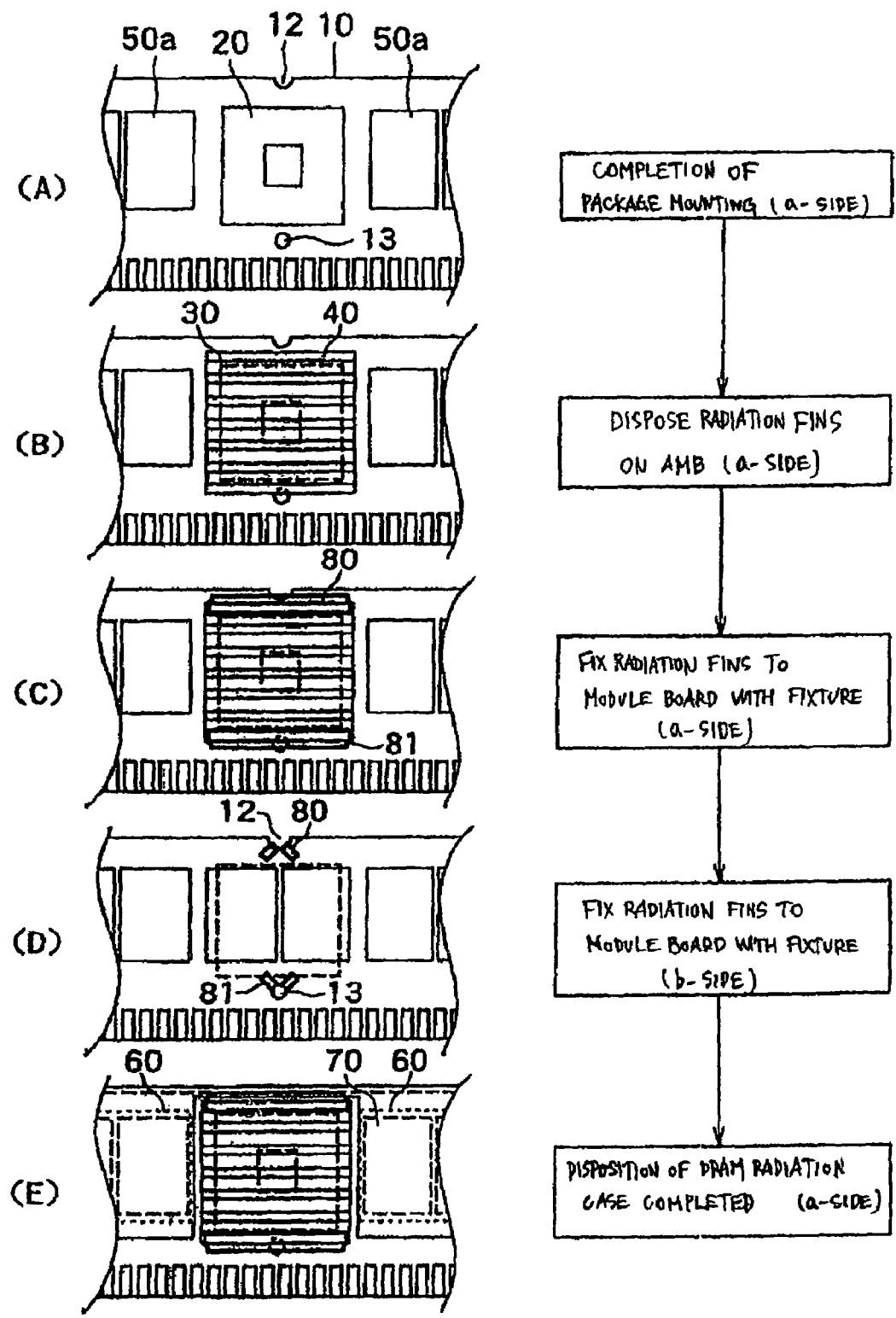
FIG. 10 is a process diagram illustrating a method of manufacturing the memory module in FIG. 1.

Next, a method of manufacturing memory module 1 of this embodiment will be described with reference to FIG. 10. FIG. 10 illustrates a process of disposing radiation member 40 and radiation member 70 after the packages have been mounted on memory module 1 of this embodiment. FIG. 10 shows in enlarged view a central region of the module on which control semiconductor package 20 is mounted.

As illustrated in FIG. 10(A), control semiconductor package 20 and semiconductor memory package 50 are mounted on module board 10 which has been previously formed with notch 12 and hole 13. Next, as illustrated in FIG. 10(B), radiation member 40 is disposed on control semiconductor package 20 through heat pass material 40. Next, as illustrated in FIG. 10(C), wire-shaped fixtures 80, 81 are attached to plate fins 42 on both sides of radiation member 40. Next, as illustrated in FIG. 10(D), fixture 80 is hooked on notch 12 of module board 10 and fixed on the b-side of the module board, while fixture 81 is fixed on the b-side of module board 10 through hole 13 of module board 10, thereby constructing control semiconductor radiator 90A. Next, as illustrated in FIG. 10(E), radiation member 70 is disposed on module board 10 through heat pass material 60, thereby constructing semiconductor memory radiator 90B. According to such a manufacturing method, it is possible to simply assemble control semiconductor radiator 90A and semiconductor memory radiator 90B of memory module 1.

Embodiment 2

Figure 11:
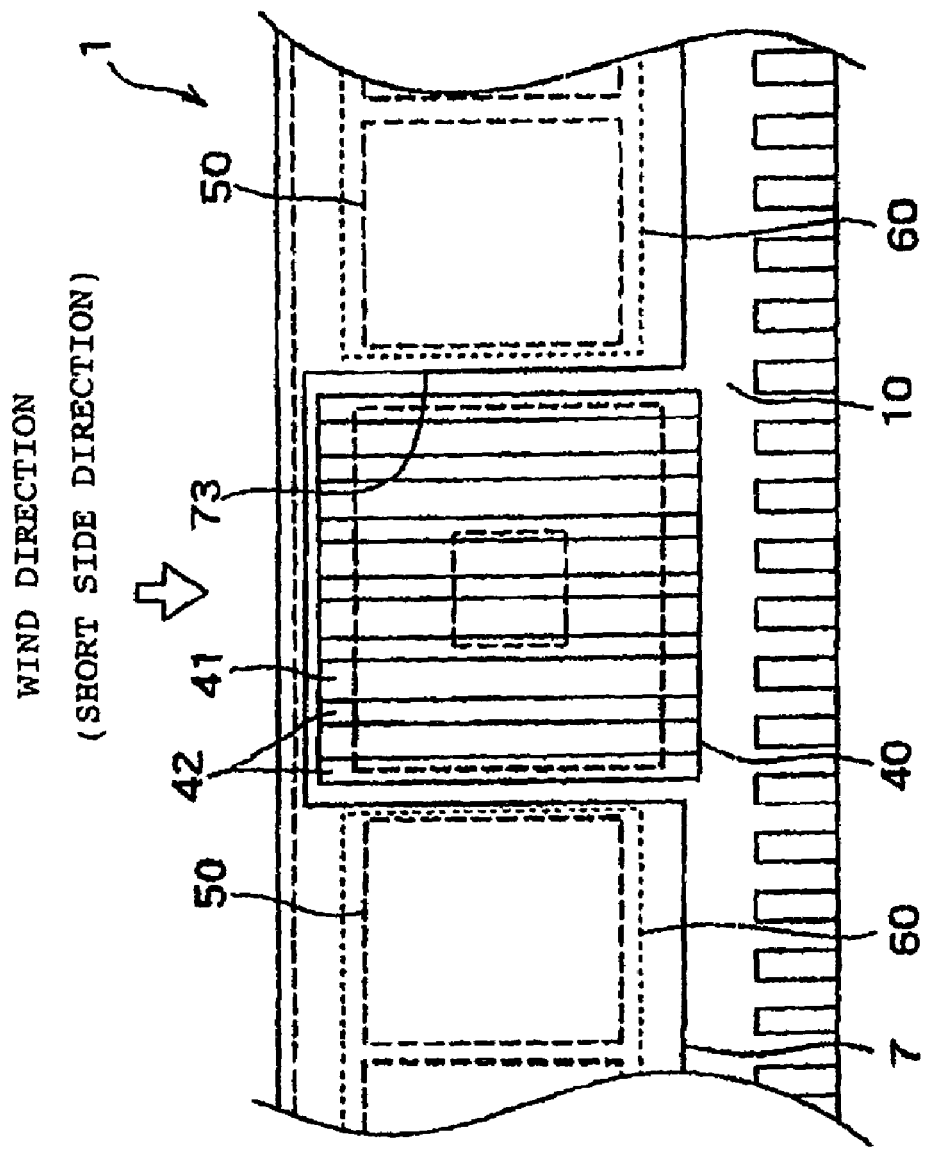
FIG. 11 is a top plan view of a control semiconductor package section in a memory module according to a second embodiment of the present invention.

Next, a second embodiment of the present invention will be described with reference to FIG. 11. This second embodiment differs from the first embodiment in the following aspect, and the remaining aspects are basically the same as the first embodiment.

In the second embodiment, the long side of plate fins 42 is arranged along the short side direction of the module board in radiation member 40 of memory module 1 according to the first embodiment. When a radiation fin length of radiation member 40 is formed along the short side of module board 10, an air flow in the short side direction of module board 10 can provide a sufficient radiation effect when radiation member 40 is cooled down.

Embodiment 3

Figure 12:
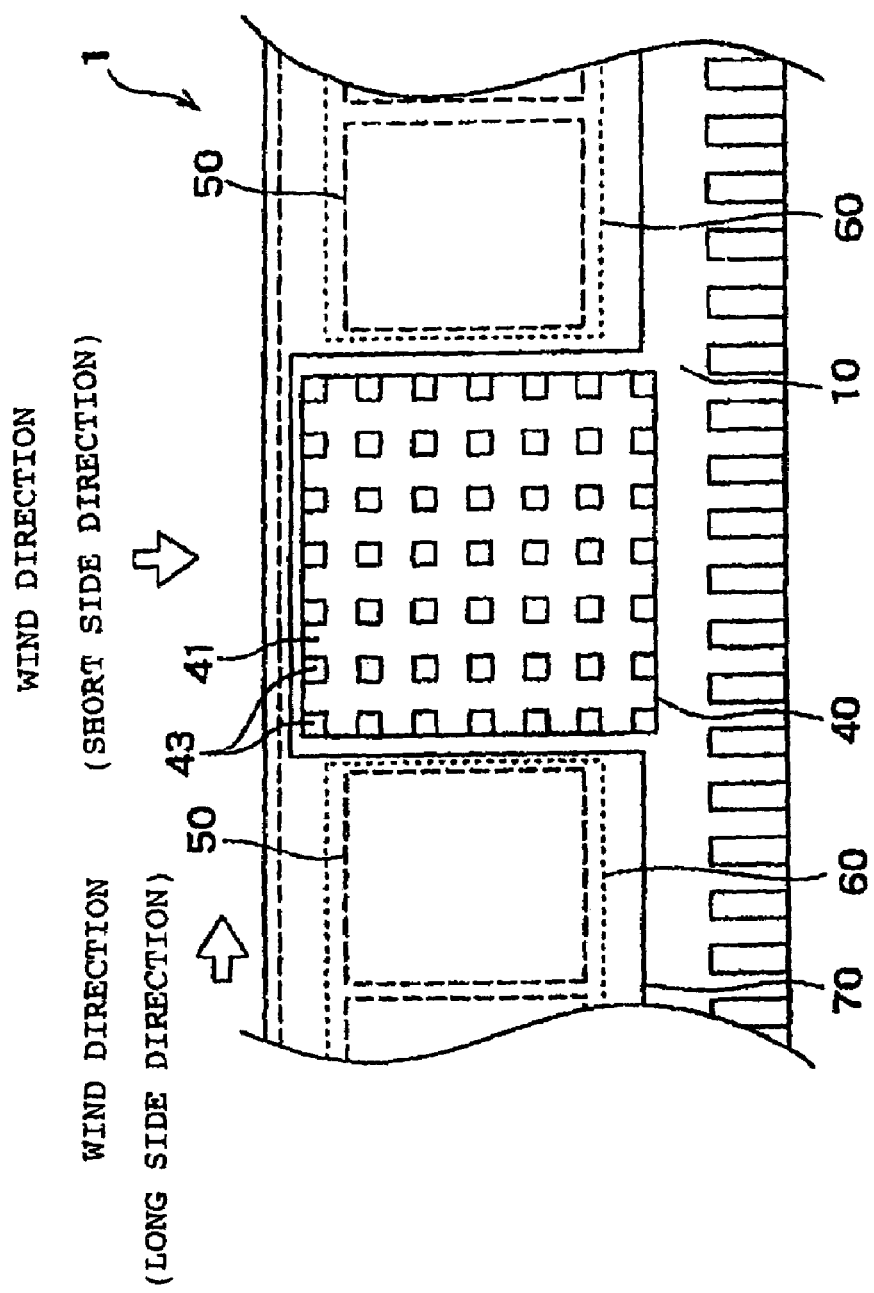
FIG. 12 is a top plan view of a control semiconductor package section in a memory module according to a third embodiment of the present invention.
Figure 13:
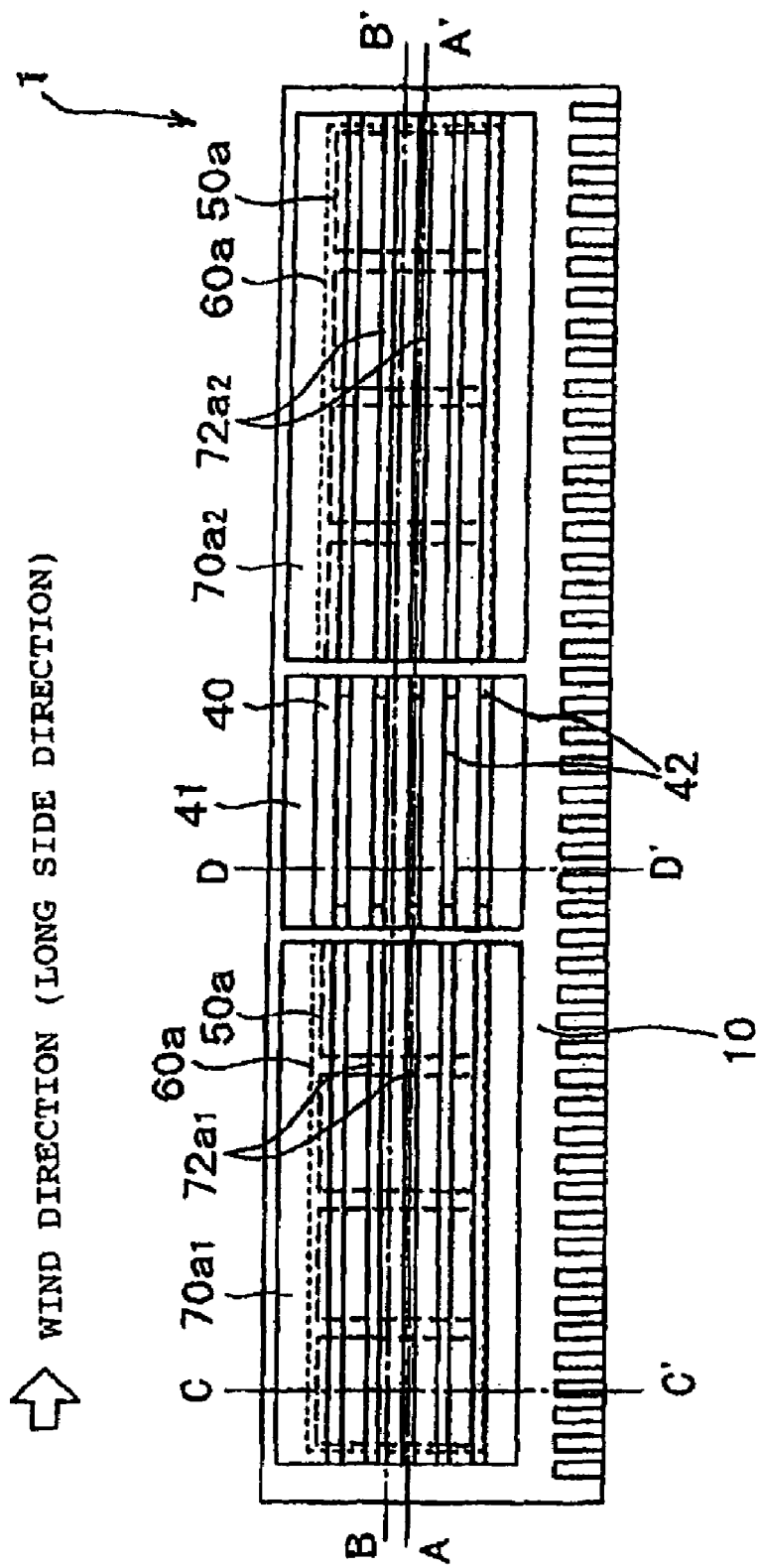
FIG. 13 is a top plan view illustrating a memory module according to a fourth embodiment of the present invention.
Figure 14:
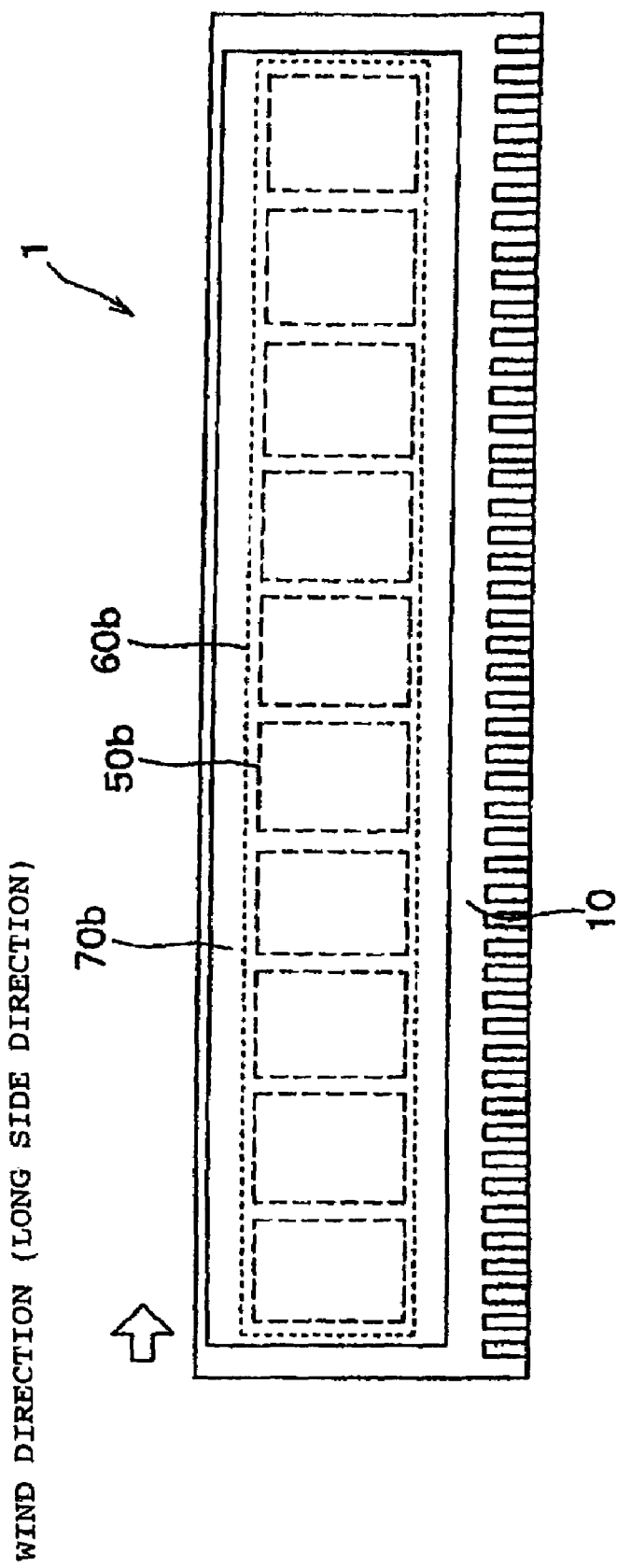
FIG. 14 is a bottom view of the memory module in FIG. 13.

Next, a third embodiment of the present invention will be described with reference to FIG. 12. This third embodiment differs from the first embodiment in the following aspect, and the remaining aspects are basically the same as the first embodiment.

In the third embodiment, pin fins 43 are substituted for plate fins 42 in radiation member 40 of memory module 1 according to the first embodiment. Pin fins 43 can provide a sufficient radiation effect irrespective of whether the direction of the winds is along the short side direction or long side direction of the module board.

Embodiment 4

Next, a fourth embodiment of the present invention will be described with reference to FIGS. 13 to 18. This fourth embodiment differs from the first embodiment in the following aspects, and the remaining aspects are basically the same as the first embodiment.

In the fourth embodiment, semiconductor memory radiation member 70 is divided into three radiation members, i.e., windward side radiation member 70a1 on the a-side of control semiconductor package 20, leeward side radiation member 70a2 of the control semiconductor package, and radiation member 70b on the b-side. Then, plate fins 72a1, 72a2 are also formed along the long side direction of module board 10 on radiation members 70a1, 70a2, as well as on radiation member 40. Since it is difficult to form plate fins only on part of radiation member 70 and bend it in an inverted C-shape as in the first embodiment, finned radiation members 70a1, 70a2 and unfinned radiation member 70b are preferably disposed separately from a viewpoint of manufacturing. A method contemplated for bonding radiation members 70a1, 70a2, 70b to module board 10 may involve forming holes, not shown, through module board 10 and radiation members 70a1, 70a2, 70b, and caulking radiation members 70a1, 70a2, 70b on the a-side and b-side with module board 10 sandwiched therebetween. Since plate fins 42 of radiation member 40 are in close proximity to plate fins 72a1, 72a2 of radiation members 70a1, 70a2, they are preferably disposed with the same fin width and pitch such that peaks and valleys of the fins are in alignment from the viewpoint of reducing in ventilation resistance, and are so arranged in this embodiment.

Figure 15:
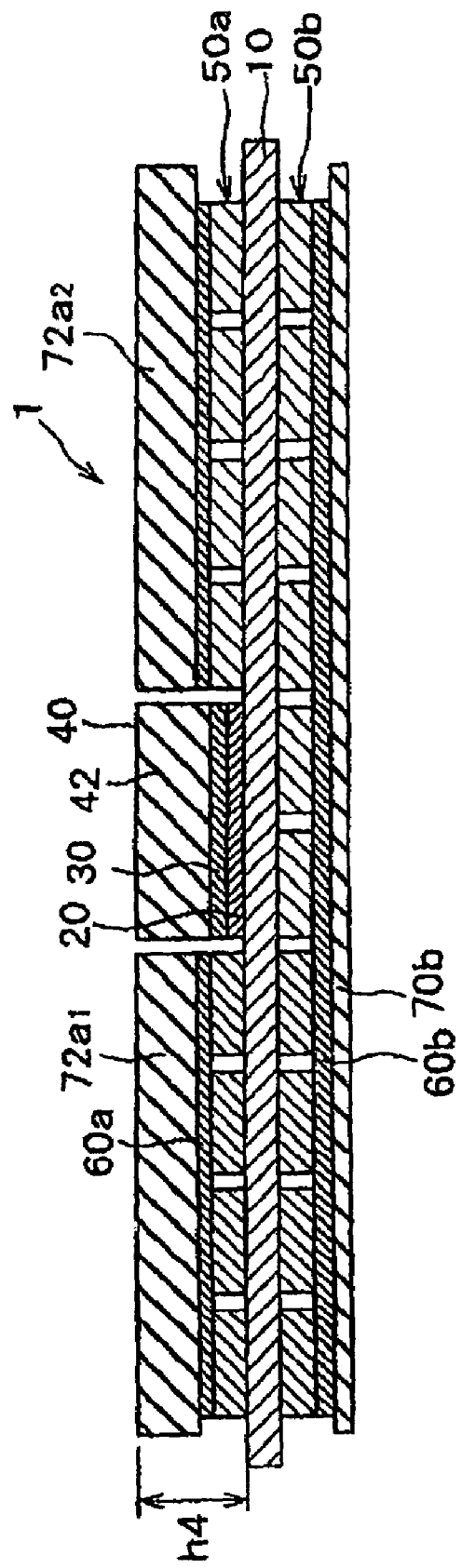
FIG. 15 is a cross-sectional view taken along A-A' in FIG. 13.

As illustrated in FIG. 15, plate fin 42 of radiation member 40 is configured to have mounting height h4 which is the same as mounting height h4 of plate fins 72a1, 72a2 of radiation members 70a1, 70a2. In this way, the radiation effect of radiation members 70a1, 702a can be improved without increasing the overall outer dimensions. In order to reduce the overall outer dimensions, radiation member 70b on the b-side is configured such that it does not any fins.

Figure 16:
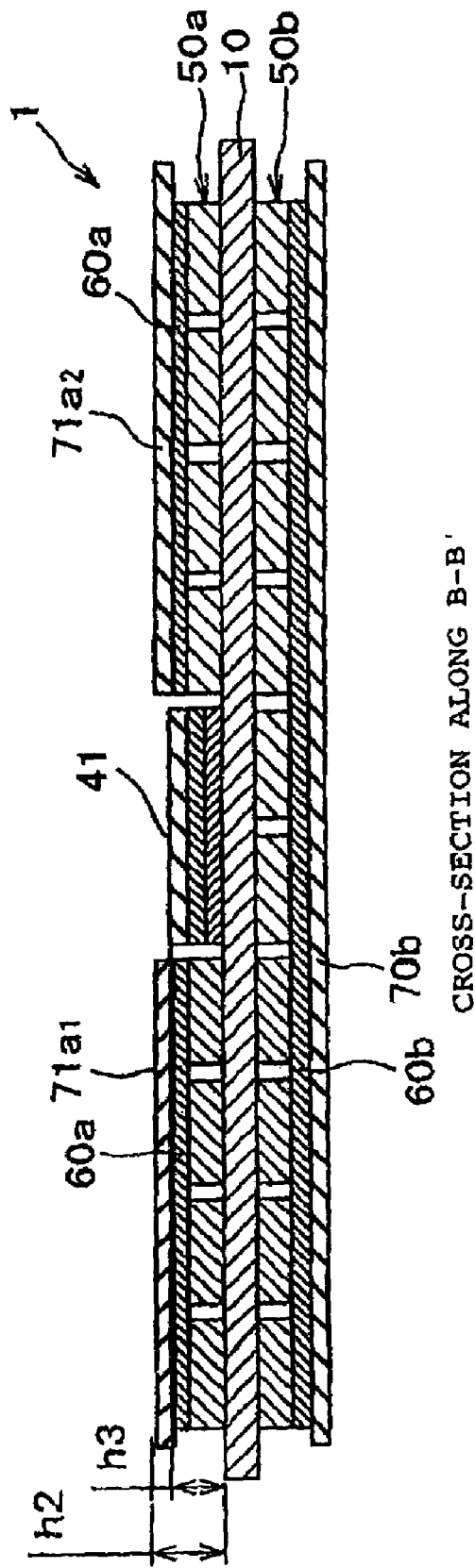
FIG. 16 is a cross-sectional view taken along B-B' in FIG. 13.

As illustrated in FIG. 16, base 41 of radiation member 40 has the top surface sinking lower than the top surfaces of bases 71a1, 71a2 of radiation member 70, and base 41 of radiation member 40 has mounting height h3 lower than mounting height h2 of bases 71a1, 71a2 of radiation member 70. This structure is similar to the first embodiment.

Figure 17:
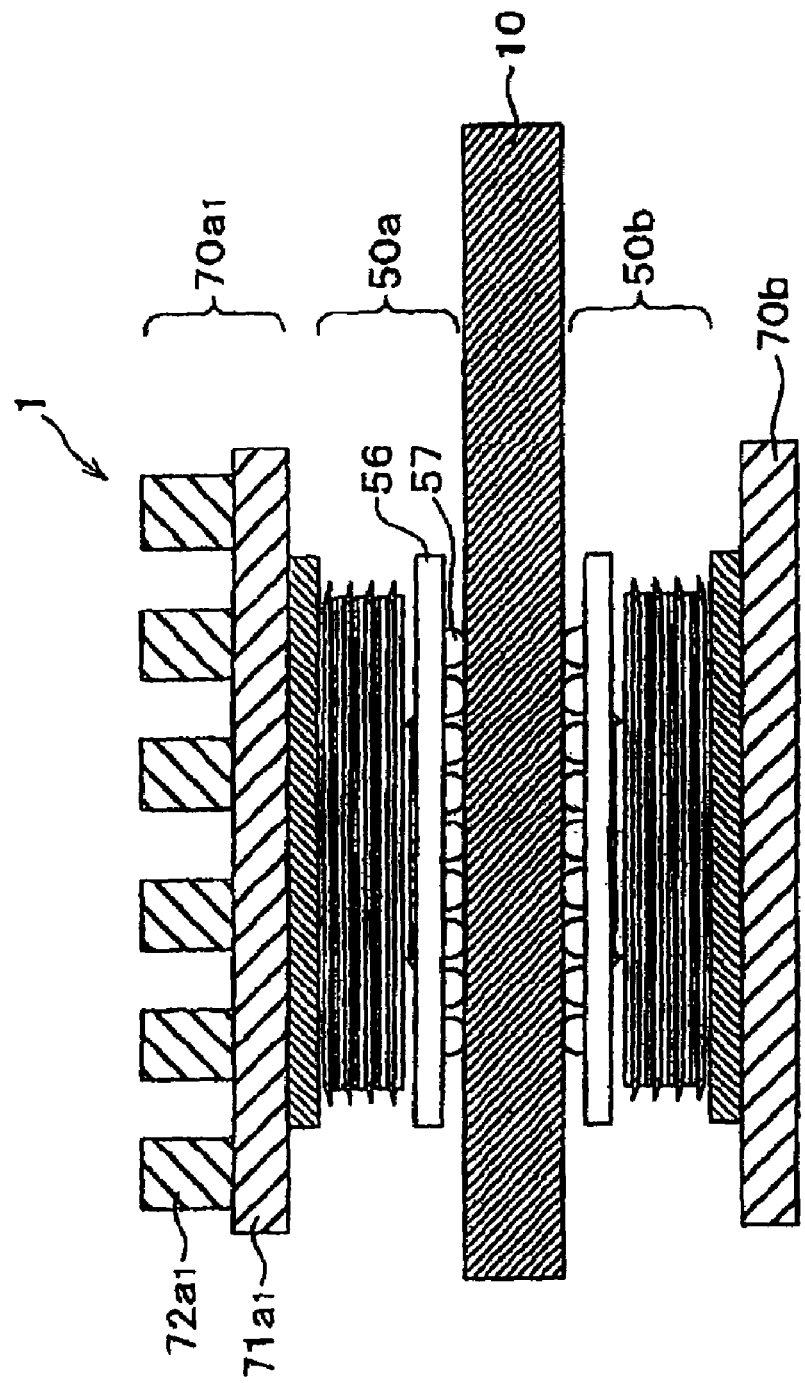
FIG. 17 is an enlarged cross-sectional view taken along C-C' in FIG. 13'

As illustrated in FIG. 17 which is a cross-sectional view of an area in which semiconductor memory packages 50 are mounted on both sides of module board 10, radiation member 70a of semiconductor memory package 50a mounted on the a-side of module board 10 is formed with fins 72a1, while radiation member 70b of semiconductor memory package 50b mounted on the b-side is formed of a flat plate, and both 72a1, 70b are separate parts.

Figure 18:
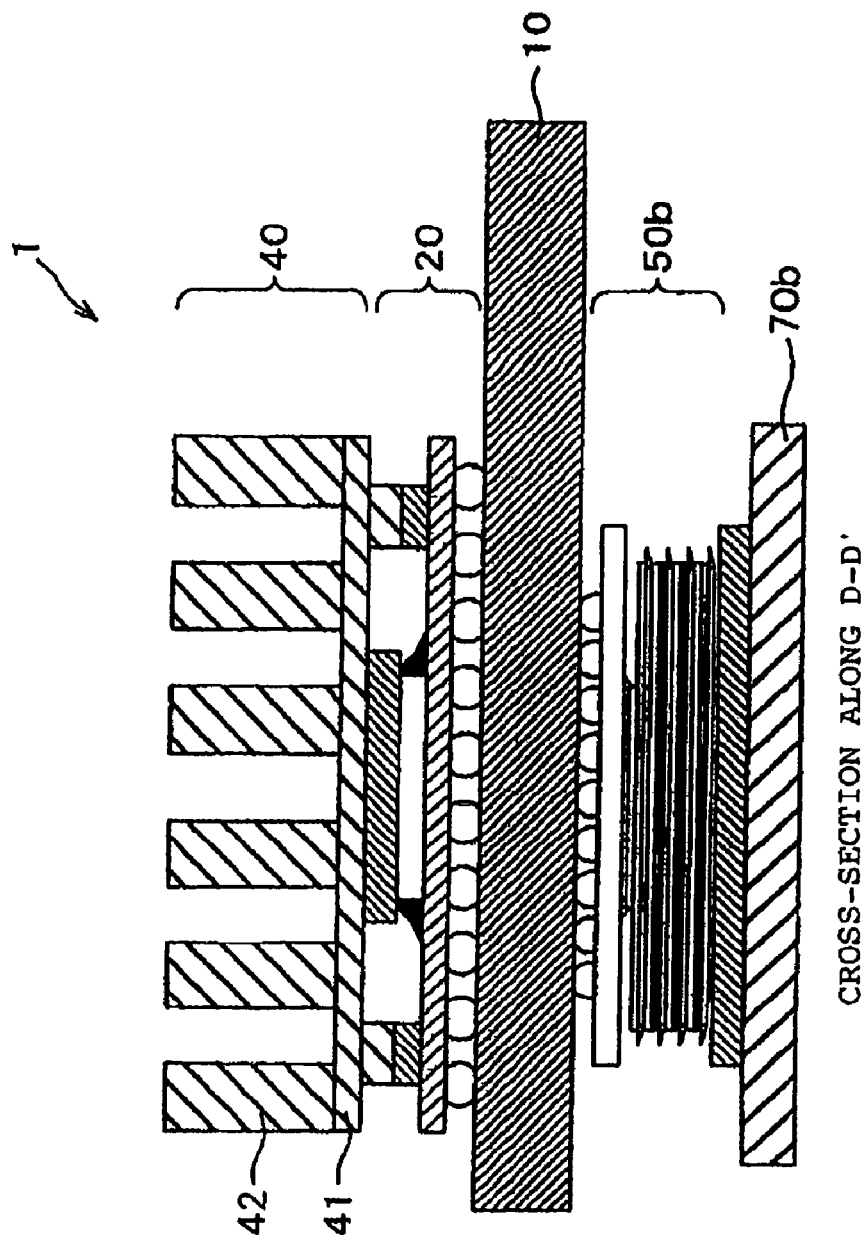
FIG. 18 is an enlarged cross-sectional view taken along D-D' in FIG. 13.

As illustrated in FIG. 18 which is a cross-sectional view of an area in which control semiconductor package 20 is mounted on the a-side of module board 10, and in which semiconductor memory package 50b is mounded on the b-side, plate fins 42 are formed on radiation member 40 of control semiconductor package 20 mounted on the a-side, while plate fin 42 is not formed on radiation member 70b of semiconductor memory package 50b mounted on the b-side, and radiation member 70b is a flat plate. In the fourth embodiment, the shape of the fins on radiation member 40 is chosen to be plate fins 42 along the long side direction of module board 10, however, as in the second and third embodiments, the plate fins may be changed in arrangement or replaced with pin fins depending on a wind direction.

Embodiment 5

Figure 19:
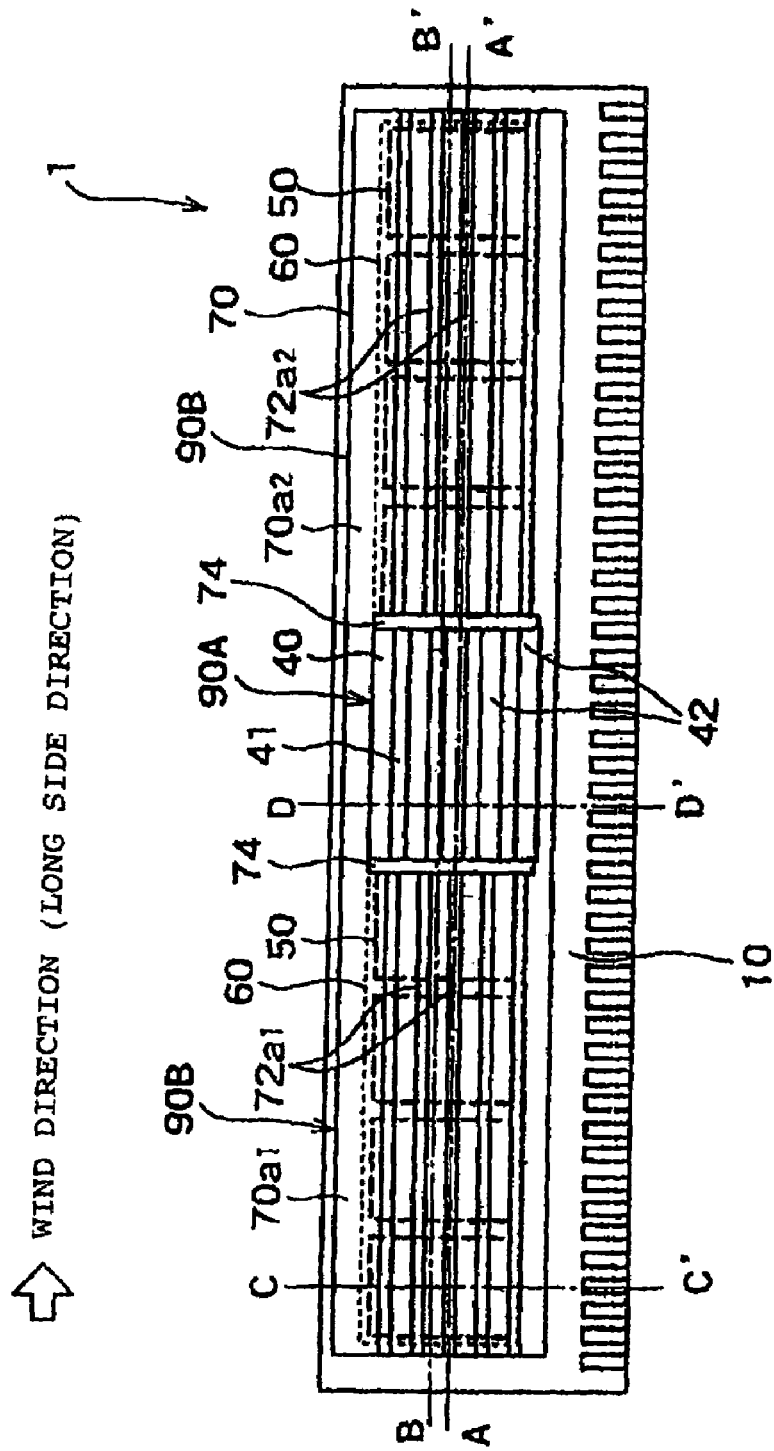
FIG. 19 is a cross-sectional view illustrating the principal part of a memory module according to a fifth embodiment of the present invention.

Next, a fifth embodiment of the present invention will be described with reference to FIG. 19. This fifth embodiment differs from the fourth embodiment in the following aspect, and the remaining aspects are basically the same as the fourth embodiment.

In the fifth embodiment, radiation member 40 of control semiconductor radiator 90A and radiation member 70 of semiconductor memory radiator 90B are constituted of the same member, and a non thermally connected portion is provided between control semiconductor radiator 90A and semiconductor memory radiator 90B in the direction in which semiconductor memory packages 50a are arranged. This non thermally connected portion is formed of slit 74 which extends in a direction which intersects the direction in which semiconductor memory packages 50a are arranged.

According to this fifth embodiment, control semiconductor radiator 90A can be readily manufactured, and can be readily disposed onto control semiconductor package 20.

What is claimed is:

1. A memory module having a plurality of semiconductor memory packages arranged and mounted on a module board, the module comprising:

a control semiconductor package disposed in a central region of the arrangement of said semiconductor memory packages and mounted on said module board, and a control semiconductor radiator thermally connected to said control semiconductor package, and a semiconductor memory radiator thermally connected to said plurality of semiconductor memory packages, wherein said control semiconductor radiator and said semiconductor memory radiator are disposed without being thermally connected to each other in a direction in which said semiconductor memory packages are arranged;

wherein the control semiconductor package and the plurality of semiconductor memory packages are mounted on a same side of said module board.

2. The memory module according to claim 1, wherein a multi-layered semiconductor memory package stacked in a plurality of layers is used as said semiconductor memory package.

3. The memory module according to claim 2, wherein the multi-layered semiconductor memory package comprises a plurality of memory chips.

4. The memory module according to claim 1, wherein:

said control semiconductor radiator and said semiconductor memory radiator are constituted of different members, and a gap is formed between said control semiconductor radiator and said semiconductor memory radiator in the direction in which said semiconductor memory packages are arranged to provide a non thermally connected part.

5. The memory module according to claim 4, wherein said control semiconductor radiator and said semiconductor memory radiator connected to said control semiconductor package and said semiconductor memory package mounted on the same side of said module board are mounted such that their respective projection planes deviate from each other.

6. The semiconductor module according to claim 5, comprising a notch recess formed in a central region of said semiconductor memory radiator, wherein said control semiconductor radiator is disposed within a projection plane of said notch recess.

7. The memory module according to claim 1, wherein:
said control semiconductor radiator and said semiconductor memory radiator are constituted of the same member, and
a non thermally connected part is defined between said control semiconductor radiator and said semiconductor memory radiator in the direction in which said semiconductor memory packages are arranged.

8. The memory module according to claim 7, wherein said non thermally connected part is formed of a slit extending in a direction which intersects the direction in which said semiconductor memory packages are arranged.

9. The memory module according to claim 1, wherein:
said control semiconductor package has a heatproof temperature that is higher than the allowable heatproof temperature of said semiconductor memory package, and
said control semiconductor radiator is provided with radiation fins.

10. The memory module according to claim 9, wherein said radiation fins provided on said control semiconductor radiator can be ventilated in any of front, rear, left and right directions.

11. The memory module according to claim 1, wherein each of said control semiconductor radiator and said semiconductor memory radiator is provided with radiation fins along a wind direction.

12. The memory module according to claim 1, wherein said plurality of semiconductor memory packages are arranged in a straight line.

13. A memory module comprising:
a module board,
a control semiconductor package mounted on a first surface of said module board,
a plurality of semiconductor memory packages mounted on the first surface of said module board and a plurality of semiconductor memory packages mounted on a second surface of said module board wherein said second surface opposes said first surface, and
a control semiconductor radiator thermally connected to said control semiconductor package, and a semiconductor memory radiator thermally connected to said plurality of semiconductor memory packages, wherein said control semiconductor radiator and said semiconductor memory radiator are disposed without being thermally connected to each other;
wherein at least one of the plurality of semiconductor memory packages mounted on the first surface of said module board and the plurality of semiconductor memory packages mounted on the second surface of said module board are disposed on the same surface of the module board as the control semiconductor package; and
wherein said control semiconductor package is disposed in a central region of the arrangement of said semiconductor memory packages.

14. The memory module according to claim 13, wherein said plurality of semiconductor memory packages are arranged in a line on the first and second surfaces, respectively.

15. The memory module according to claim 14, wherein said control semiconductor radiator and said semiconductor memory radiator are disposed such that their respective projection planes in the each surfaces deviate from each other.

16. The memory module according to claim 15, comprising a notch recess formed in a central region of said semiconductor memory radiator, wherein said control semiconductor radiator is disposed within a projection plane of said notch recess.

17. The memory module according to claim 13, wherein said control semiconductor radiator and said semiconductor memory radiator are constituted of different members.

* * * * *